(12) United States Patent
Takemoto et al.

(10) Patent No.: US 8,324,507 B2
(45) Date of Patent: Dec. 4, 2012

(54) COMPOSITE METALLIC PARTICLE, DISPERSION OF A COMPOSITE METALLIC PARTICLE, INK FOR MAKING A CONDUCTIVE SUBSTRATE, METHOD FOR MAKING A CONDUCTIVE SUBSTRATE AND A CONDUCTIVE SUBSTRATE

(75) Inventors: Kiyohiko Takemoto, Matsumoto (JP); Miharu Kanaya, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 643 days.

(21) Appl. No.: 12/546,117

(22) Filed: Aug. 24, 2009

(65) Prior Publication Data

US 2010/0059260 A1    Mar. 11, 2010

(30) Foreign Application Priority Data

Aug. 22, 2008 (JP) ................. 2008-213642

(51) Int. Cl.
*H05K 1/09* (2006.01)
*B05D 5/12* (2006.01)
*H01B 1/22* (2006.01)

(52) U.S. Cl. ............ 174/257; 427/58; 252/512

(58) Field of Classification Search .............. 174/257; 427/58; 252/512
See application file for complete search history.

(56) References Cited

U.S. PATENT DOCUMENTS 1,403,556 A * 1/1922 Lihme ................... 159/49
4,689,250 A * 8/1987 Quella et al. ............ 427/216

FOREIGN PATENT DOCUMENTS

JP    2005120226 A    5/2005
JP    2007332299 A    12/2007

* cited by examiner

*Primary Examiner* — Robert S Loewe
(74) *Attorney, Agent, or Firm* — Nutter McClennen & Fish LLP; John J. Penny, Jr.

(57) ABSTRACT

A composite metallic particle made by coating a surface of a base material sheet with a composite metallic thin film layer that contains at least one of a resin layer and a wax layer and at least one of a metal layer and a metal compound layer and step 2 for removing the composite metallic thin film layer from the sheet. The resultant composite metallic particles and conductive ink can be used in a conductive substrate producing apparatus, formed into a pattern on the conductive substrate by screen printing, an ink jet method, or some other liquid-based process.

18 Claims, 4 Drawing Sheets

COMPOSITE METALLIC PARTICLE, DISPERSION OF A COMPOSITE METALLIC PARTICLE, INK FOR MAKING A CONDUCTIVE SUBSTRATE, METHOD FOR MAKING A CONDUCTIVE SUBSTRATE AND A CONDUCTIVE SUBSTRATE

CROSS-REFERENCES TO RELATED APPLICATIONS

The entire disclosure of Japanese Patent Application No. 2008-213642, filed on Aug. 22, 2008 is expressly incorporated by reference herein.

FIELD OF THE INVENTION

The present invention relates to a composite metallic particle, a dispersion of a composite metallic particle, an ink for making a conductive substrate, a method for making a conductive substrate, and a conductive substrate.

BACKGROUND OF THE INVENTION

Recent proposals include methods for making conductive substrates using a liquid-based process such as screen printing or an ink jet method. Liquid-based processes require less investment in facilities and use less consumable materials than, for example, ones using vapor deposition of a selected kind of metal, ITO, or the like to form a conductive substrate pattern or those using etching of a copper film or an aluminum film attached to an insulating resin for the same purpose; thus, such processes allow significant reduction of manufacturing cost. However, conductive substrates made using a liquid-based process contain vast amounts of impurities and thus are difficult to produce with a desired conductivity. As solutions to this problem, researchers have proposed many improved conductive inks for liquid-based manufacturing processes; however, all of them are lacking in practicality when seen from the viewpoint of cost-effectiveness

RELATED ART

[Patent Document 1] Japanese Unexamined Patent Application Publication No. 2005-120226
[Patent Document 2] Japanese Unexamined Patent Application Publication No. 2007-332299

SUMMARY OF THE INVENTION

Problems to be Solved by the Invention

Objects of the present invention include providing composite metallic particles for conductive inks and a conductive ink, both allowing the production of highly conductive substrates using a liquid-based process such as screen printing or an ink jet method with simpler equipment and at a lower cost, providing a method for making such a conductive substrate, and providing such a conductive substrate.

Means for Solving the Problems

Thus, the present invention is completed with the following constitutions.
(1) The present invention includes Step 1 for coating a surface of a base material sheet with a composite metallic thin film layer that contains at least one of a resin layer and a wax layer and at least one of a metal layer and a metal compound layer and Step 2 for removing the composite metallic thin film layer from the sheet. The resultant composite metallic particles can be used to form a conductive substrate.
(2) The present invention further includes Step 3 for making a dispersion of composite metallic particles by dispersing the composite metallic particles in a liquid and Step 4 for conditioning an ink that contains at least the dispersion of composite metallic particles. The resultant ink for making a conductive substrate can be used in a liquid-based process to form a patterned conductive layer. If necessary, Steps 2 and 3 may be performed simultaneously.
(3) The present invention further includes Step 5 for forming a patterned conductive layer using the ink for making a conductive substrate by a liquid-based process such as screen printing or an ink jet method. Step 5 is preferable because it allows relatively large conductive substrates to be made with the cost regarding patterning using an ink jet method reduced.
(4) The present invention further includes Step 6 for heating the formed patterned conductive layer.

REFERENCE NUMERALS

Figure 1:
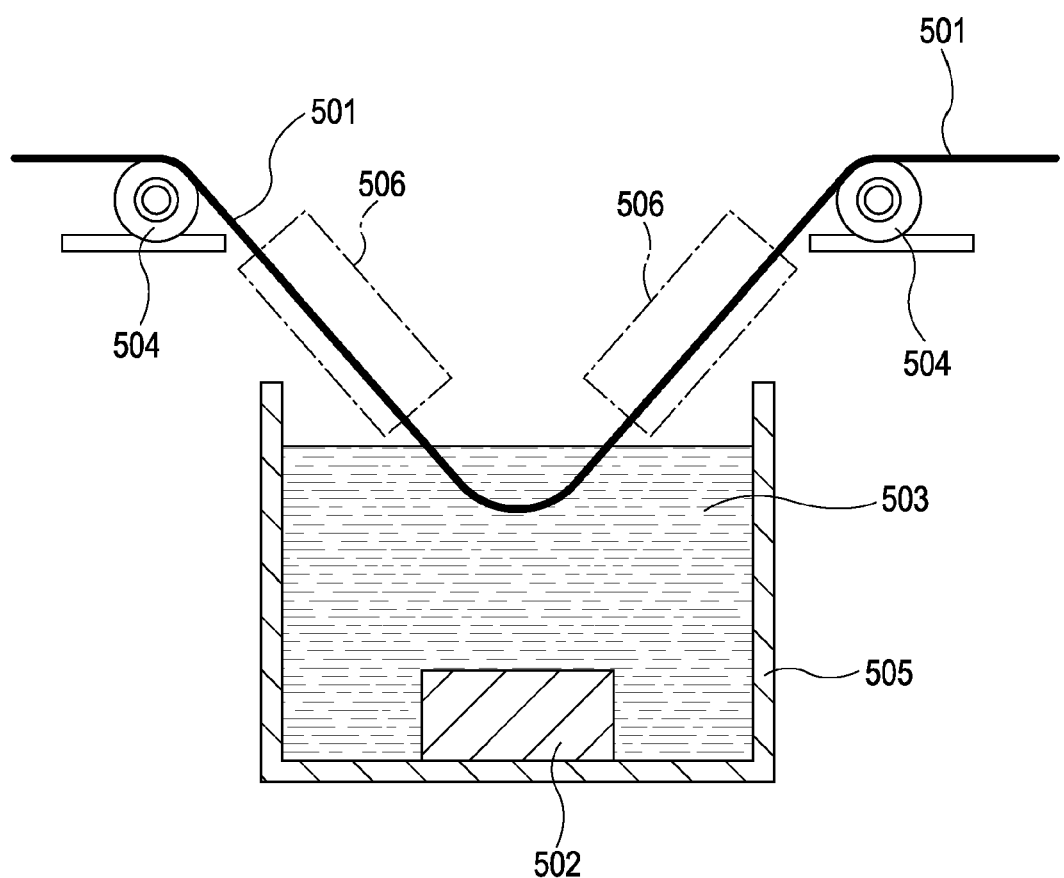
FIG. 1 is a cross-sectional diagram showing an apparatus used in the present invention to remove a composite metallic thin film layer from a base material sheet.

1 . . . ink jet head unit, 2 . . . motor for X-direction movement, 3 . . . motor for Y-direction movement, 4 . . . X-direction guiding shaft, 5 . . . Y-direction guiding shaft, 6 . . . control unit, 7 . . . stage, 8 . . . cleaning mechanism, 9 . . . base, 11 . . . ink jet head, 12 . . . ink droplet, 15 . . . heater, 21 . . . conductive layer, 22 . . . conductive substrate, 100 . . . patterned conductive layer forming apparatus, 101 . . . substrate, 300 . . . first substrate, 303 . . . pixel region, 310 . . . signal electrode, 310a . . . pixel electrode area, 310b . . . signal distributing wire, 331 . . . first connecting wire, 332 . . . second connecting wire, 340 . . . vertical conduction terminal, 341 . . . vertical conduction material, 350 . . . liquid crystal driving circuit, 501 . . . base material sheet, 502 . . . ultrasonic oscillator, 503 . . . liquid dispersant for composite light-emitting particles, 504 . . . sheet feeder, 505 . . . bath, 506 . . . sheet support/tension adjuster.

DETAILED DESCRIPTION OF THE PRESENT INVENTION

The following describes embodiments of the present invention with reference to drawings.
(Step 1)
(Base Material Sheet)
Examples of the base material sheet used in the present invention in making composite light-emitting particles include, but not limited to, a film made of polyester such as polytetrafluoroethylene, polyethylene, polypropylene, polyethylene terephthalate, and polyethylene naphthalate, a film made of polyamide such as 66 nylon and 6 nylon, and a removable film such as a polycarbonate film, a triacetate film, and a polyimide film.

Preferred examples of the base material sheet include polyethylene terephthalate and its copolymers.

No particular limitation is imposed on the thickness of the base material sheet; however, the thickness is preferably in the range of 10 μm to 150 μm. With a thickness of equal to or greater than 10 μm, the base material sheet causes no difficulties in handling during steps involving it; with a thickness of equal to or smaller than 150 μm, the base material sheet is highly flexible and thus can be rolled, removed, or handled in other ways without any difficulties.

(Resin Layer or Wax Layer)

The resin layer or wax layer used in the present invention is an undercoat layer of a metal layer or a metal compound layer and also is a removable layer that facilitates the removal of itself from the surface of the base material sheet.

Thus, preferred examples of applicable resins include, but not limited to, resins easily soluble in water or organic solvents such as cellulose derivatives, polyvinyl alcohols, polyethylene glycol, polyacrylic acid, polyacrylamide, polyvinyl butyral, and acrylic acid copolymers, and modified nylon resins.

Preferred examples of applicable waxes are those that are solid at room temperature and include, but not limited to, tricosanone, heptacosanone, 1-hexadecanol, 1-octadecanol, 1,2-decanediol, 1,10-decanediol, 1,12-dodecanediol, monolaurin, monostearin, monoolein, acetamide, lauric acid amide, stearic acid amide, and oleic acid amide. In the method for making a conductive substrate according to the present invention, the conductive substrate had better retain only a minimum amount of residual resin or wax for an intended conductivity achieved after the final step, namely, heating of a conductive layer. Thus, wax is advantageous over resin. More preferred examples of applicable waxes include those easily soluble in water or organic solvents, low-melting-point waxes having a melting point on the order of 50° C. to 150° C., and those that easily sublime when heated.

The resin layer or the wax layer is formed by a commonly used method such as gravure coating, roller coating, blade coating, extrusion coating, dip coating, or spin coating. After being applied and dried, the layer may be treated in a calender to have a smoother surface, if necessary. In this case, the coating solution may contain additives such as a viscosity modifier.

The thickness of the resin layer or the wax layer is preferably in the range of 0.5 μm to 50 μm, but is not limited to this range. When the thickness is smaller than 0.5 μm, the layer has an insufficient mechanical strength; however, when the thickness is greater than 50 μm, too high a mechanical strength may make the layer difficult to grind and disperse.

(Metal Layer or Metal Compound Layer)

Examples of the material for the metal layer or the metal compound layer used in the present invention include platinum, gold, silver, copper, zinc, nickel, aluminum, tin, magnesium, and their oxides. These materials may be used alone or in combination of two or more kinds.

A preferred way of making the layer is vacuum deposition described as follows: one of these metals and metal compounds is placed in a vacuum chamber and then resistively heated until sublimation and evaporation so that the material accumulates as a thin film on the resin layer or the wax layer covering the surface of the base material sheet. This method allows vapor deposition of a mixture containing several metals. Examples of other applicable thin film forming methods include ion plating and sputtering.

The thickness of the metal layer or the metal compound layer is in the range of 5 nm to 50 nm and preferably in the range of 10 nm to 30 nm.

The step described above of forming a composite metallic thin film layer that contains at least one of the resin layer and wax layer and at least one of the metal layer and metal compound layer is named Step 1 of the present invention.

(Step 2)

The present invention may include an additional step in which composite metallic particles are obtained by removing the composite metallic thin film layer formed during Step 1, which contains at least one of the resin layer and wax layer and at least one of the metal layer and metal compound layer, from the base material sheet while utilizing the resin layer or wax layer as a boundary, and then grinding the composite metallic thin film layer into fine particles.

Examples of the method for removal include, but not limited to, one in which the light-emitting layer is mechanically removed using a squeegee, one in which the light-emitting layer is immersed in a liquid, and one in which the light-emitting layer is sonicated while being immersed in a fluid.

The following describes in detail an apparatus with which the composite metallic thin film layer formed on the film is immersed in a liquid and then sonicated until detachment.

FIG. 1 is a cross-sectional diagram showing an apparatus used in the present invention to remove the composite metallic thin film layer from the base material sheet in a liquid.

A bath 505 contains a liquid dispersant for composite metallic particles 503 and has a 38-KHz ultrasonic oscillator 502 on the bottom thereof. A sheet feeder 504 feeds a base material sheet 501 covered with a composite metallic thin film layer into the liquid dispersant; more specifically, it works in concert with a sheet support/tension adjuster 506 to feed the base material sheet 501 by pulling at a controlled speed so that ultrasound can hit the surface of the composite metallic thin film layer in an efficient manner. Even when both faces of the base material sheet 501 are covered with composite metallic thin film layers for higher production efficiency, the sheet feeder 504 can feed the base material sheet 501 without damaging the composite metallic thin film layers thanks to the function thereof to control the speed and the tension. Furthermore, the structure of the sheet feeder 504 allows reverse feeding, and thus the base material sheet 501 can be fed into the liquid dispersant as many times as necessary.

The obtained composite metallic particles are collected by filtration as solid matter with a filtering apparatus. After that, the particles may be washed in an organic solvent until the resin or wax adhering thereto is removed. The step described above of making the composite metallic particles by removing the composite metallic thin film layer from the sheet is named Step 2.

(Step 3)

The present invention may include an additional step in which a dispersion of the composite metallic particles is obtained by grinding and dispersing the composite metallic particles obtained during Step 2 in a liquid by sonication, using a sand mill, an atomizer, or Nanomizer, or by some other means. The obtained dispersion may undergo treatments for removal of coarse particles, such as filtration through a filtering apparatus or centrifugation, to have a narrower particle size distribution, if necessary.

The average diameter of the composite metallic particles contained in the dispersion is, when measured as a 50% volume average particle diameter using a dynamic-light-scattering-based particle size analyzer such as Microtrac UPA series (manufactured by Microtrac, Inc.), preferably on the order of 0.03 μm to 3 μm.

Such flat composite metallic particles, having a thickness in the range of 5 nm to 50 nm or preferably in the range of 10 nm to 30 nm and a 50% volume average particle diameter determined to be in the range of 0.5 μm to 3 μm using a dynamic-light-scattering-based particle size analyzer, gives a patterned conductive layer after treated in a liquid-based process, individually oriented and deposited efficiently, and the metal or metal compound contained therein can be burnt by heating at a relatively low temperature. As a result, the conductive layer has a desired conductivity. In other words, the resultant conductive substrate, formed on a heat-labile plastic film that cannot be exposed to high temperatures, is made of a conductive layer with a high conductivity. When the thickness of the metal or the metal compound is smaller than 5 nm, the composite metallic particles have a low mechanical strength, causing difficulty in obtaining a stable dispersion of the composite metallic particles; however, when the thickness is greater than 50 nm, the flat composite metallic particles are sometimes oriented and deposited nonuniformly, requiring burning at a very high temperature to give the resultant conductive layer a desired conductivity.

A dispersion treatment may be additionally carried out by addition of a surfactant, a resin, or some other dispersant, if necessary. In such a case, the surfactant or the resin acts as protective colloid, further improving the dispersion stability of the composite metallic particles.

The steps described above of making a dispersion of composite metallic particles by dispersing the composite metallic particles in a liquid are collectively named Step 3.

If Step 2 is performed in a liquid, Step 3 can be conducted seamlessly with Step 2. In such a case, the apparatus shown in FIG. 1 can be continuously used, effectively improving the dispersion stability of the composite metallic particles.

(Step 4)

In the present invention, an ink for making a conductive substrate is obtained; the ink contains at least the dispersion of composite metallic particles obtained in Step 3 described above and further contains additives to have properties optimized for the purposes of consistent formation of a patterned conductive layer via a liquid-based process using a simple apparatus and of improved performance of a finished conductive substrate.

In particular, an ink jet method necessitates that the ink have carefully adjusted properties including viscosity, surface tension, contact angle with the base material, dynamic properties regarding the film formation by evaporation of the solvent, and so forth. For example, the ink may contain a resin emulsion, a surfactant, a leveling agent, or some other agent for stabilizing the resultant coatings as well as a pH modifier, an antiseptic, an anticorrosive, and so forth.

The choices of the liquid used in Step 3 described above and the solvent used in conditioning the ink in this step are very important. Examples of acceptable solvents include water and/or organic solvents including ethylene glycol, ethylene glycol monoethyl ether, ethylene glycol diethyl ether, ethylene glycol monobutyl ether, ethylene glycol monobutyl ether acetate, diethylene glycol, diethylene glycol monoethyl ether, diethylene glycol diethyl ether, diethylene glycol monobutyl ether, diethylene glycol monobutyl ether acetate, triethylene glycol, triethylene glycol monoethyl ether, triethylene glycol diethyl ether, triethylene glycol monobutyl ether, triethylene glycol monobutyl ether acetate, propylene glycol monomethyl ether, propylene glycol-n-propyl ether, propylene glycol-n-butyl ether, propylene glycol monomethyl ether acetate, dipropylene glycol monomethyl ether, tripropylene glycol-n-butyl ether, tetraethylene glycol dimethyl ether, tetraethylene glycol monobutyl ether, 1,3-butylene glycol, 1,3-butylene glycol diacetate, 2-pyrrolidone, N-methyl-2-pyrrolidone, γ-butyrolactone, and so forth, with preferred examples being ones having a vapor pressure in the range of 0.01 mmHg to 20 mmHg at 20° C. An organic solvent having too low a vapor pressure would be likely to stay in the conductive layer, causing difficulty in achieving a desired conductivity; however, an organic solvent having too high a vapor pressure would cause difficulty in stable discharge of the resultant ink from a nozzle port during patterning, in particular, patterning by an ink jet method.

The concentration of composite metallic particles in the ink is preferably in the range of 1 wt % to 30 wt % and more preferably in the range of 2 wt % to 10 wt %.

These steps described above of conditioning an ink for making a conductive substrate, the ink containing at least a dispersion of composite metallic particles and having a composition suitable for making a conductive substrate via the formation of a patterned conductive layer in a liquid-based process, are collectively named Step 4.

(Step 5)

The present invention further includes a step of forming a patterned conductive layer using the ink for making a conductive substrate produced in Step 4 described above, which contains at least a dispersion of composite metallic particles; this step is named Step 5. The method for forming the patterned conductive layer may be photolithography, screen printing, an ink jet method, or the like. In particular, patterning based on an ink jet method gives large displays at a low cost and thus is preferable.

The ink jet method mentioned herein represents a method in which the ink is discharged from an ink jet head so as to form certain patterns, and offers the following advantages: easy and rapid formation of fine patterns, easy control of the thickness of the resultant coating by increasing/decreasing the amount of the ink discharged, and, as a result of these, easy and flexible control of the appearance and the color reproduction properties, such as color balance and brightness, of the resultant coating. This method can also provide a laminated pattern consisting of several layers, if necessary.

Figure 2:
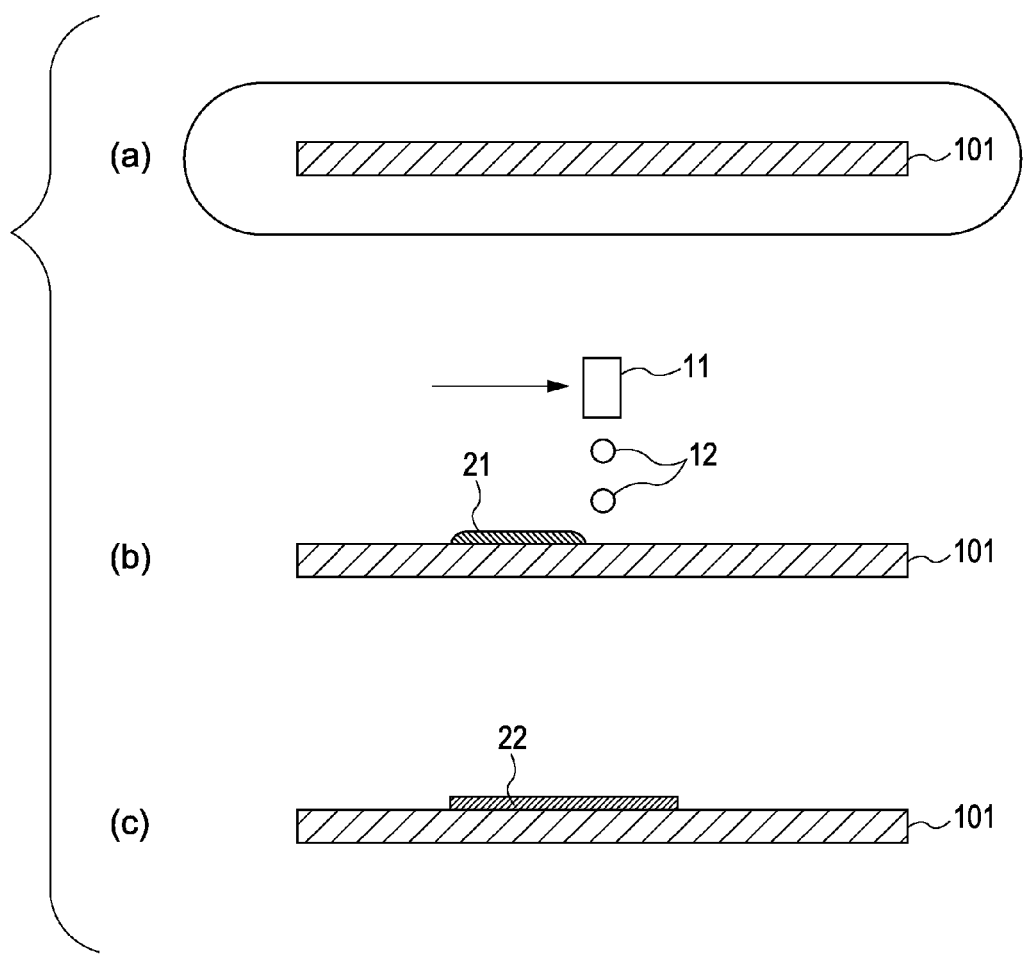
FIGS. 2(a) to 2(c) are diagrams that illustrate methods for making a conductive substrate according to the present invention.

FIGS. 2(*a*) to 2(*c*) are diagrams that illustrate methods for making a conductive substrate according to the present invention, in particular, a method for making a conductive substrate via the formation of a patterned conductive layer by an ink jet method.

First, a substrate 101 for the conductive substrate is prepared as shown in FIG. 2(*a*). The substrate 101 may be a silicon substrate, a quartz glass substrate, a glass substrate, a plastic film substrate, a metal substrate, or the like. The surface of the substrate may be coated with a semiconductor film, a metal film, a dielectric film, an organic film, or some other film serving as an underlayer formed thereon.

Then, an ink for making a conductive substrate according to the present invention is applied to the substrate 101 as shown in FIG. 2(*b*). The ink droplets 12 are dropped down to the substrate 101 at an interval that is controlled by adjusting the discharge frequency and the relative speed of the ink jet head 11 to the substrate 101. A particularly preferred interval is one at which adjacent two of ink droplets 12 overlaps on the substrate 101 with the width of each overlap being in the range of 1% to 10% of the diameter of the ink droplets 12. In other words, the distance between the ink droplets 12, measured on the substrate 101, is preferably in the range of 90% to 99% of the diameter of the ink droplets 12. When the distance between the ink droplets 12 is shorter than the lower limit of the specified range, or when the width of each overlap of the ink droplets 12 is greater than the upper limit of the specified range, bulges are formed, preventing the resultant conductive substrate from having favorable lines. However, when the distance between the ink droplets 12 is longer than the upper limit of the specified range, or when the width of each overlap of the ink droplets 12 is smaller than the lower limit of the specified range, fluctuations in the positions of discharged ink droplets make some of the ink droplets 12 separated from the next ones, resulting in a broken conductive layer 21 and a broken conductive substrate 22. The apparatus used in the formation of a patterned conductive layer will be described later.

(Step 6)

Preferably, the present invention further includes a step of heating the conductive layer obtained in Step 5 described above.

The substrate 101 is heated so that the resin or the wax contained in the composite metallic particles remaining in the patterned conductive layer and the liquid or other components used in the dispersion of the composite metallic particles are evaporated and that the metal or the metal compound is burnt; as a result, the substrate 101 has improved electric contact and a desired conductivity.

This heating treatment is usually conducted in the air, but may be performed in nitrogen, argon, helium, or some other inert gas as needed.

The heating temperature is at least 50° C., preferably at least 150° C., and more preferably at least 250° C. During the heating treatment, a reduced pressure assists evaporation in finishing faster at a lower temperature. Such conditions prevent the substrate of the conductive substrate from being deformed or damaged.

The heating treatment may be performed in twice or more. In such a case, for example, the first phase is conducted at a low temperature at which the dispersant can be removed (drying), and then the second phase is conducted at a high temperature (burning). The time of heat treatment (total time when the heat treatment is performed in twice or more) is preferably in, but not limited to, the range of 5 minutes to 5 hours.

The heating treatment may be carried out by ordinary means, such as a hot plate or an electric furnace, or by lamp annealing. Examples of the light source of the light for lamp annealing include, but not limited to, an infrared lamp, a xenon lamp, a YAG laser, an argon laser, a carbon dioxide laser, excimer lasers such as XeF, XeCl, XeBr, KrF, KrCl, ArF, and ArCl lasers, and so forth. These light sources usually have an output in the range of 10 W to 5000 W; however, in this embodiment, an output in the range of 100 W to 1000 W is sufficient.

In addition, when a single set of the application and heating steps cannot give the resultant conductive substrate a desired thickness, the application and heating steps may be repeated so that a laminate of conductive layers can be formed. For example, the conductive substrate may be produced by taking the following steps in the following order: application of a conductive layer 21 to the substrate 101, heating (drying), application, heating (burning).

The thickness of the conductive substrate 22 is preferably in the range of 0.1 μm to 10 μm and more preferably in the range of 1 μm to 5 μm. A thickness exceeding the specified upper limit may result in a reduced uniformity of the conductive substrate 22; however, a thickness falling below the specified lower limit may result in an increased electric resistance of the conductive substrate 22.

This step for heating a patterned conductive layer is named Step 6.

Steps 1 to 5 and Step 6 described above constitute the formation of a conductive substrate 22.

<Patterned Conductive Layer Formation Apparatus>

Figure 3:
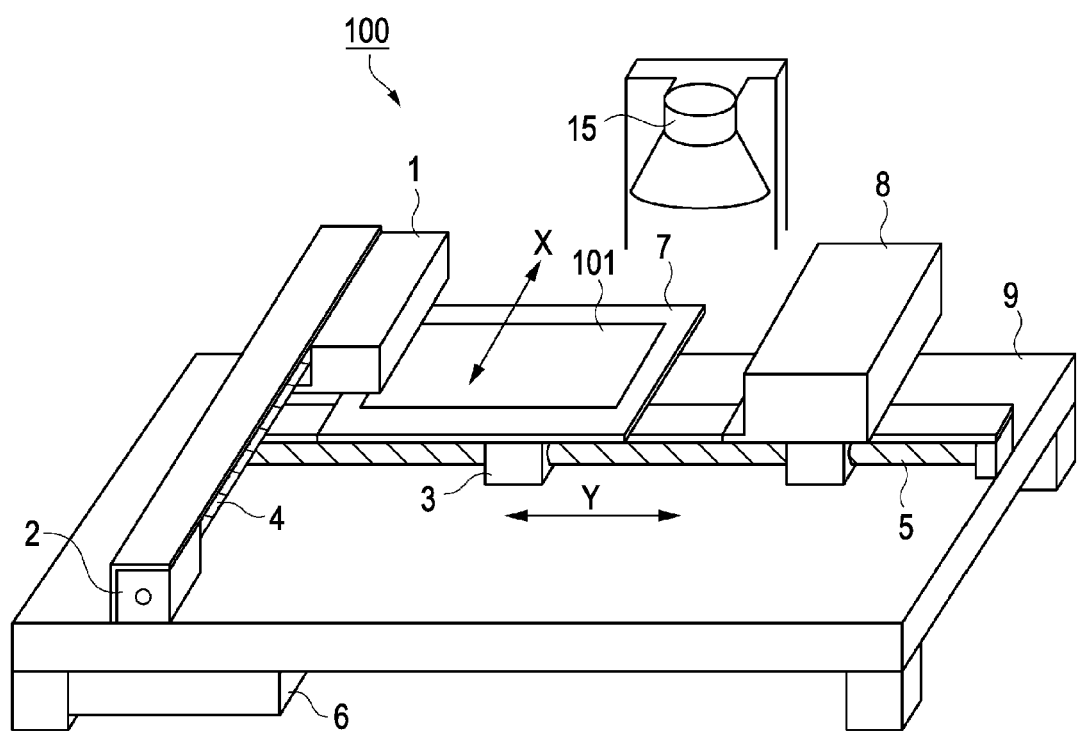
FIG. 3 is a schematic perspective diagram showing an apparatus used in the present invention to form a patterned conductive layer.

FIG. 3 is a schematic perspective diagram showing an apparatus used in the present invention to form a patterned conductive layer.

The patterned conductive layer formation apparatus 100 has an ink jet liquid application unit as well as an ink jet head unit 1, an X-direction guiding shaft 4, a Y-direction guiding shaft 5, a control unit 6, a stage 7, a cleaning mechanism 8, a base 9, and a heater 15.

The ink jet head unit 1 has heads, each of which is used as an ink jet application means for discharging a certain liquid through a nozzle (a discharge port) to a substrate 101 with a predetermined interval.

The stage 7 supports a substrate 101 to which the application apparatus applied a conductive layer 21, and has a mechanism for fixing the substrate 101 in a reference position.

The X-direction guiding shaft 4 is connected to a motor for X-direction movement 2, which is a stepping motor or the like and, on receiving X-direction movement signals transmitted by the control unit 6, drives the ink jet head unit 1 to move along the X-axis.

The Y-direction guiding shaft 5 is secured to the base 9. The stage 7 has a motor for Y-direction movement 3, which is a stepping motor or the like and, on receiving Y-direction movement signals transmitted by the control unit 6, drives the stage 7 to move along the Y-axis.

The control unit 6 supplies voltage for droplet discharge control to the individual heads built in the ink jet head unit 1 and also transmits driving pulse signals for controlling the X-direction movement of the ink jet head unit 1 and those for controlling the Y-direction movement of the stage 7 to the motor for X-direction movement 2 and the motor for Y-direction movement 3, respectively.

The cleaning mechanism 8 has a mechanism for cleaning the ink jet head 1 and has a motor for Y-direction movement not shown in the drawing. This motor for Y-direction movement drives the cleaning mechanism 8 to move along the Y-direction guiding shaft 5 under the control by the control unit 6.

The heater 15 mentioned herein is a means for heating the substrate 101 by lamp annealing and evaporates and dries the conductive layer 21 applied to the substrate 101 as well as converts the layer into a functional material layer. This heater is also turned on and off under the control by the control unit 6.

The patterned conductive layer formation apparatus 100 according to this embodiment provides a thick conductive layer with a desired fine pattern while avoiding the formation of bulges.

<Conductive Substrate>

Figure 4:
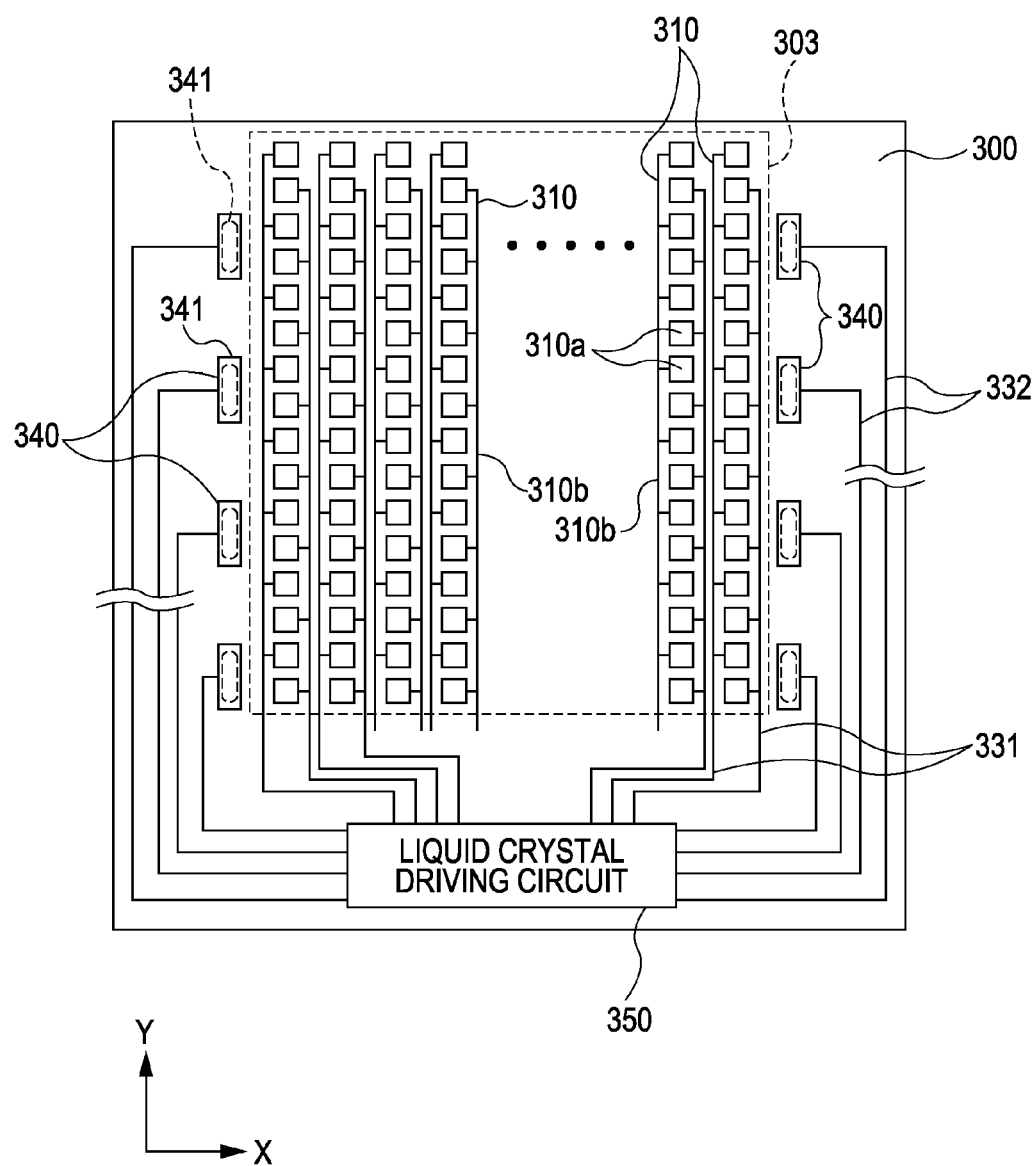
FIG. 4 is a plan view of a conductive substrate made in accordance with the present invention.

The following details a conductive substrate produced in the way described above. FIG. 4 is a plan view of the layout of signal electrodes and other elements arranged on a first substrate (a circuit substrate) of a liquid crystal display, whose major components include the first substrate, a second substrate with scanning electrodes (not shown in the drawing), and liquid crystals sandwiched between the first and second substrates (not shown in the drawing).

As shown in FIG. 4, the first substrate 300 has a pixel region 303, in which several signal electrodes 310 are arranged in multiple matrices. In particular, each signal electrode 310, extending in the Y-direction, has several pixel electrode areas 310a individually corresponding to pixels and further has a signal distributing wire 310b that links the pixel electrode areas 310a arranged in multiple matrices.

The first substrate 300 also has a liquid crystal driving circuit 350, which is structured of a single chip and is connected to an end of each signal distributing wire 310b (the lower side of the drawing) via first connecting wires 331.

The first substrate 300 also has vertical conduction terminals 340, each of which is connected to a terminal provided on the second substrate not shown in the drawing via a vertical conduction material 341. The vertical conduction terminals 340 are also connected to the liquid crystal driving circuit 350 via second connecting wires 332.

In this embodiment, the signal distributing wires 310b, first connecting wires 331, and second connecting wires 332 provided on the first substrate 300 are individually produced using the patterned conductive layer formation apparatus 100 in the method described above for making a conductive substrate. This liquid crystal display is unlikely to encounter breakage, short circuit, and other defects of the wires described above and, when mounted on an apparatus, allows the apparatus to have a smaller size and a smaller thickness than before.

The following describes the present invention in more detail with reference to examples; however, these examples never limit the scope of the present invention, of course.

EXAMPLES

Example 1

Preparation of a Base Material Sheet

Acetamide melted at 80° C. (subliming waxy matter) was applied to a PET film having a thickness of 100 μm using a roll coater and then dried. In this way, a wax layer was formed. The wax layer obtained under the conditions described above had a thickness of 5 μm.

<Formation of a Metal Layer of a Metal Compound Layer>

Using a vapor deposition apparatus capable of continuous treatment of films, copper was vapor-deposited on the wax layer described above until the thickness of the vapor deposition layer reached 10 nm.

<Production of a Dispersion of Composite Metallic Particles and an Ink for Making a Conductive Substrate>

The PET film treated as above, which had a composite metallic thin film layer constituted by the wax layer and the metal or metal compound layer, was immersed in purified water, and then the composite metallic thin film layer was removed from the PET film and divided into particles using the removing/dispersing apparatus shown in FIG. 1.

Then, an organic solvent and a surfactant were added to the dispersion as needed. In this way, an ink for making a conductive substrate was produced with the following composition.

TABLE-US-00001 (Ink for making a conductive substrate) Composite copper particles 5.0 wt % N-methyl-2-pyrrolidone 2.0 wt % BYK-347 (a silicone-based surfactant manufactured by 0.5 wt % BYK) Purified water Balance The obtained ink was analyzed for particle size distribution in Microtrac UPA 150 (manufactured by Microtrac Inc.), and the 50% volume average particle diameter was determined to be approximately 0.1 μm.

<Step for Making a Conductive Substrate Via the Formation of a Patterned Conductive Layer by an Ink Jet Method>

The obtained ink for making a conductive substrate was loaded on the conductive substrate producing apparatus shown in FIG. 3 and then discharged on a substrate 101 to form a conductive layer under the following conditions: the amount of ink droplet per dot: 20 ng; the line width of the resultant pattern: 50 μm; the thickness of the resultant conductive layer: 6 μm. The substrate obtained was heated under argon atmosphere at 70° C. for 1 hour until the wax, organic solvent, surfactant, and other components contained in the ink were removed and aluminum was burnt. In this way, a conductive substrate was formed with the thickness of the conductive layer being 1 μm.

Example 2

Preparation of a Base Material Sheet

A waxy coating solution having the composition described below was applied to a PET film having a thickness of 50 μm by spin coating and then dried. In this way, a wax layer was formed.

TABLE-US-00002 (Coating solution for the wax layer) 1,10-decanediol (wax component) 3.0 wt % γ-butyrolactone 5.0 wt % Isopropyl alcohol Balance TABLE-US-00003 (Conditions under which the wax layer was formed) Coating conditions: Spinning at 500 rpm for 5 seconds, followed by spinning at 2000 rpm for 30 seconds Drying conditions: 50° C., 30 seconds The wax layer obtained under these conditions had a thickness of 8 μm.

<Formation of a Metal Layer of a Metal Compound Layer>

Using the apparatus specified below, aluminum and copper were vapor-deposited on the wax layer described above until the thickness of the vapor deposition layer reached 20 nm; the aluminum:copper weight ratio was 90:10.

Apparatus: VE-1010 Vacuum Evaporator (manufactured by Vacuum Device Inc.)

<Production of a Dispersion of Composite Metallic Light-Emitting Particles and an Ink for Making a Conductive Substrate>

The PET film treated as above, which had a composite metallic thin film layer constituted by the wax layer and the metal or metal compound layer, was peeled off from the metallic thin film layer using a squeegee, so that composite metallic particles were left.

The composite metallic particles obtained were washed in isopropyl alcohol and then, after a dispersant and an organic solvent were added thereto, processed together with glass beads (having a diameter of 1.7 mm and 1.5-fold the amount (weight) of the mixture) in a sand mill (manufactured by Yasukawa Seisakusho Co., Ltd.) for 2 hours until dispersion.

The glass beads were removed, and then the remaining mixture was centrifuged under the conditions specified below for removal of coarse particles. In this way, an ink for making a conductive substrate was produced with the composition described below.

Centrifugation conditions: 10,000 rpm.times.30 min.

TABLE-US-00004 (Ink for making a conductive substrate) Composite aluminum-copper particles 10.0 wt % Solsperse 20000 (a hyperdispersant manufactured by 5.0 wt % Lubrizol Corporation) Diethylene glycol monobutyl ether acetate 5.0 wt % 1,3 butylene glycol diacetate Balance The ink obtained was analyzed for particle size distribution in Microtrac UPA 150 (manufactured by Microtrac Inc.), and the 50% volume average particle diameter was determined to be approximately 0.15 μm <Step for Making a Conductive Substrate Via the Formation of a Patterned Conductive Layer by an Ink Jet Method>

The obtained ink for making a conductive substrate was loaded on the conductive substrate producing apparatus shown in FIG. 3 and then discharged on a substrate 101 to form a conductive layer under the following conditions: the amount of ink droplet per dot: 15 ng; the line width of the resultant pattern: 40 μm; the thickness of the resultant conductive layer: 8 μm. The substrate obtained was heated under nitrogen atmosphere at 200° C. for 2 hours until the wax, organic solvent, surfactant, and other components contained in the ink were removed and aluminum-copper was burnt. In this way, a conductive substrate was formed with the thickness of the conductive layer being 1.5 μm.

Example 3

Preparation of a Base Material Sheet

A resin coating solution having the composition described below was applied to a PET film having a thickness of 100 μm by spin coating and then dried. In this way, a resin layer was formed.
TABLE-US-00005 (Coating solution for the resin layer) Cellulose acetate butyrate (molecular weight: 16,000; 5.0 wt % percent butyrate moiety: 50% to 54%) Diethylene glycol diethyl ether 95.0 wt %
TABLE-US-00006 (Conditions under which the resin layer was formed) Coating conditions: Spinning at 500 rpm for 10 seconds, followed by spinning at 2,000 rpm for 30 seconds Drying conditions: 100° C., 30 seconds The resin layer obtained under these conditions had a thickness of 10 μm.

<Formation of a Metal Layer of a Metal Compound Layer>

Using the apparatus specified below, silver was vapor-deposited on the resin layer described above until the thickness of the vapor deposition layer reached 30 nm.

Apparatus: VE-1010 Vacuum Evaporator (manufactured by Vacuum Device Inc.)

<Production of a Dispersion of Composite Light-Emitting Particles>

The PET film treated as above, which had a composite metallic thin film layer constituted by the resin layer and the metal or metal compound layer, was immersed in diethylene glycol diethyl ether, and then the composite metallic thin film layer was removed from the PET film and divided into particles using an ultrasonic dispersing machine.

Then, an organic solvent and a surfactant were added to the dispersion as needed. In this way, an ink for making a conductive substrate was produced with the following composition.
TABLE-US-00007 (Ink for making a conductive substrate) Composite silver particles 20.0 wt % Dipropylene glycol monomethyl ether 20.0 wt % Diethylene glycol diethyl ether Balance The ink obtained was analyzed for particle size distribution in Microtrac UPA 150 (manufactured by Microtrac Inc.), and the 50% volume average particle diameter was determined to be approximately 0.3 μm.

<Step for Making a Conductive Substrate Via the Formation of a Patterned Conductive Layer by an Ink Jet Method>

The obtained ink for making a conductive substrate was loaded on the conductive substrate producing apparatus shown in FIG. 3 and then discharged on a substrate 101 to form a conductive layer under the following conditions: the amount of ink droplet per dot: 5 ng; the line width of the resultant pattern: 30 μm; the thickness of the resultant conductive layer: 5 μm. The obtained substrate was heated under nitrogen atmosphere at 250° C. for 30 minutes until the resin component, organic solvent, and other components contained in the ink were removed and silver was burnt. In this way, a conductive substrate was formed with the thickness of the conductive layer being 2 μm.

[Evaluation]

The conductive substrates produced in Examples 1 to 3 were analyzed with an ohmmeter for volume resistivity. The results are shown in Table 1. Then, inspection revealed that the conductive substrates were favorable in quality with no defects (faults) such as cracks and pinholes, breakage, or short circuit. In these substrates, the dimensional precision was also very high.
TABLE-US-00008 TABLE 1 Example 1 Example 2 Example 3 4 .times. 10.sup.−5 8 .times. 10.sup.−5 3 .times. 10.sup.−4 (.OMEGA. cm)

The method for making a conductive substrate according to the present invention was better than ones using vapor deposition of a selected kind of metal, ITO, or the like to form a conductive substrate pattern, ones using etching of a copper film or an aluminum film attached to an insulating resin for the same purpose, and one in which a pattern is formed using a conductive ink in a previously proposed liquid-based process such as screen printing or an ink jet method, because of much simpler steps and equipment involved and much lower manufacturing cost needed. The method for making a conductive substrate according to the present invention was better than ones using vapor deposition of a selected kind of metal, ITO, or the like to form a conductive substrate pattern, ones using etching of a copper film or an aluminum film attached to an insulating resin for the same purpose, and one in which a pattern is formed using a conductive ink in a previously proposed liquid-based process such as screen printing or an ink jet method, because of much simpler steps and equipment involved and much lower manufacturing cost needed.

What is claimed is:

1. A composite metallic particle made in steps comprising Step 1: coating a surface of a base material sheet with a composite metallic thin film layer that comprises a resin layer and at least one of a metal layer and a metal compound layer, and Step 2: removing the composite metallic thin film layer from the sheet, and Step 3: grinding the composite metallic thin film layer into composite metallic fine particles.

2. A dispersion of a composite metallic particle made by dispersing the composite metallic particle according to claim 1 in a liquid.

3. An ink for making a conductive substrate comprising the dispersion of a composite metallic particle according to claim 2.

4. The ink for making a conductive substrate according to claim 3, wherein the solvent for the ink for making a conductive substrate is water and/or an organic solvent having a vapor pressure in the range of 0.01 mmHg to 20 mmHg at 20° C.

5. A conductive substrate comprising a pattern formed using the composite metallic particle according to claim 1.

6. A composite metallic particle made in steps comprising Step 1: coating a surface of a base material sheet with a composite metallic thin film layer that comprises a wax layer and at least one of a metal layer and a metal compound layer, and Step 2: removing the composite metallic thin film layer from the sheet, and Step 3: grinding the composite metallic thin film layer into composite metallic fine particles.

7. The composite metallic particle according to claim 1 or claim 6, wherein the metal layer or the metal compound layer has a thickness in the range of 5 nm to 50 nm.

8. The composite metallic particle according to claim 1 or claim 6, wherein the metal layer or the metal compound layer has a thickness in the range of 10 nm to 30 nm.

9. A dispersion of a composite metallic particle made by dispersing the composite metallic particle according to claim 6 in a liquid.

10. A conductive substrate comprising a pattern formed using the composite metallic particle according to claim 6.

11. A method for making a conductive substrate comprising Step 1: coating a surface of a base material sheet with a composite metallic thin film layer that comprises at least one of a resin layer and a wax layer and at least one of a metal layer and a metal compound layer, Step 2: making a composite metallic particle by removing the composite metallic thin film layer from the sheet and grinding the composite metallic thin film layer into composite metallic fine particles, Step 3: making a dispersion of a composite metallic particle by dispersing the composite metallic fine particles in a liquid, Step 4: preparing an ink for making a conductive substrate, the ink comprising the dispersion of the composite metallic fine particles, and Step 5: forming a patterned conductive layer using the ink.

12. The method for making a conductive substrate according to claim 11, further comprising Step 6: heating the patterned conductive layer.

13. A conductive substrate made using the method for making a conductive substrate according to claim 11.

14. A method for making a conductive substrate comprising Step 1: coating a surface of a base material sheet with a composite metallic thin film layer that comprises at least one of a resin layer and a wax layer and at least one of a metal layer and a metal compound layer, Step 2: making a composite metallic particle by removing the composite metallic thin film layer from the sheet and grinding the composite metallic thin film layer into composite metallic fine particles, Step 3: making a dispersion of composite metallic particles by dispersing the composite metallic fine particles in a liquid, Step 4: preparing an ink for making a conductive substrate, the ink comprising the dispersion of the composite metallic fine particles, and Step 5: forming a patterned conductive layer using the ink for making a conductive substrate by an ink jet method.

15. The method for making a conductive substrate according to claim 11 or claim 14, wherein the metal layer or the metal compound layer has a thickness in the range of 5 nm to 50 nm.

16. The method for making a conductive substrate according to claim 11 or claim 14, wherein the metal layer or the metal compound layer has a thickness in the range of 10 nm to 30 nm.

17. The method for making a conductive substrate according to claim 14, further comprising Step 6: heating the patterned conductive layer.

18. A conductive substrate made using the method for making a conductive substrate according to claim 14.

* * * * *